US006948942B1

(12) United States Patent
Chih

(10) Patent No.: US 6,948,942 B1
(45) Date of Patent: Sep. 27, 2005

(54) BOARD-TO-BOARD CONNECTOR ASSEMBLY

(75) Inventor: Kuo-Hua Chih, Taoyuan (TW)

(73) Assignee: Amphenol Taiwan Corporation, Taoyuan (TW)

( * ) Notice: Subject to any disclaimer, the term of this patent is extended or adjusted under 35 U.S.C. 154(b) by 0 days.

(21) Appl. No.: 10/971,078

(22) Filed: Oct. 25, 2004

(51) Int. Cl.$^7$ ............................................. H01R 29/00
(52) U.S. Cl. ....................................... 439/66; 439/374
(58) Field of Search ............................. 439/65, 66, 74, 439/83, 374, 864

(56) References Cited

U.S. PATENT DOCUMENTS

| 5,882,212 | A | * | 3/1999 | McHugh et al. | 439/74 |
| 6,036,504 | A | * | 3/2000 | McHugh et al. | 439/74 |
| 6,059,580 | A | * | 5/2000 | Konno et al. | 439/74 |
| 6,287,151 | B1 | * | 9/2001 | Matsuzaki et al. | 439/630 |
| 6,623,308 | B2 | * | 9/2003 | Ono | 439/680 |
| 6,729,890 | B2 | * | 5/2004 | Shin | 439/74 |

* cited by examiner

Primary Examiner—Thanh-Tam Le
(74) Attorney, Agent, or Firm—Troxell Law Office, PLLC

(57) ABSTRACT

A board-to-board connector assembly is used to electrically connect a first circuit board and a second circuit board and has a receptacle connector and an engaging element assembled together. The receptacle connector includes an insulative housing and a plurality of conductive terminals received in the insulative housing. An engaging groove is defined in the receptacle connector and has the same shape as the engaging element for receiving the engaging element therein. The engaging element forms positioning portions thereon for guiding the receptacle connector to mate with a circuit board accurately and facilitating the terminals to contact electrodes on the circuit board firmly. The engaging element is firmly and accurately retained in the receptacle connector to assure reliable signal transmission between the first circuit board and the second circuit board. Simultaneously the overall height of the board-to-board connector assembly is effectively decreased.

8 Claims, 3 Drawing Sheets

BOARD-TO-BOARD CONNECTOR ASSEMBLY

BACKGROUND OF THE INVENTION

1. Field of the Invention

The present invention relates to a board-to-board connector assembly, and particularly to a board-to-board connector assembly, which has low profile and which electrically connects a PCB and a flexible circuit board to assure reliable signal transmission therebetween.

2. Related Art

A connector assembly, which is adapted to electrically connect with a PCB and a flexible circuit board, generally comprises a plug and a receptacle connector connected together. U.S. Pat. Nos. 5,224,866, 5,639,248, 5,800,186, 6,036504, 6,036549, 6,296,524 and 6,729,890 disclose such a structure. This conventional structure, however, has some deficiencies as following:

Firstly, in the conventional connector assembly, terminals of the plug and terminals of the receptacle connector electrically connect with each other for signal transmission. At the same time the conductive terminals of the plug and the conductive terminals of the receptacle connector have to be soldered to the PCB and the flexible circuit board, respectively. The height of the connector assembly is equal to the sum of height of the plug and the receptacle connector, which hinders development of connector assembly with low profile.

Secondly, conducive terminals of the plug and conducive terminals of the receptacle connector contact each other side by side. That is, the plug and the receptacle connector mate with each other in the same direction as the direction of the conducive terminals thereof mating with each other. Thus the conducive terminals of the plug and the receptacle connector tend to contact unreliably. Additionally, the conducive terminals are apt to abrade, especially for the conductive terminals having a portion below a contact portion made of strips.

SUMMARY OF THE INVENTION

Accordingly, an object of the present invention is to provide a board-to-board connector assembly, which has low profile and is assembled firmly to assure stable signal transmission.

The board-to-board connector assembly comprises a receptacle connector and an engaging element assembled together. The receptacle connector includes an insulative housing and a plurality of conductive terminals received in the insulative housing. An engaging groove is defined in the receptacle connector and has the same shape as the engaging element for receiving the engaging element therein. The engaging element forms positioning portions thereon for guiding the receptacle connector to mate with a first circuit board accurately and facilitating the terminals to contact electrodes on the first circuit board firmly.

Each conductive terminal includes a contact portion at an end thereof, a soldering portion at an opposite end thereof and a connecting portion between the contact portion and the soldering portion. The contact portion vertically contacts the electrodes on the first circuit board. The soldering portion electrically connects with a second circuit board.

DESCRIPTION OF THE PREFERRED EMBODIMENTS

Figure 1:
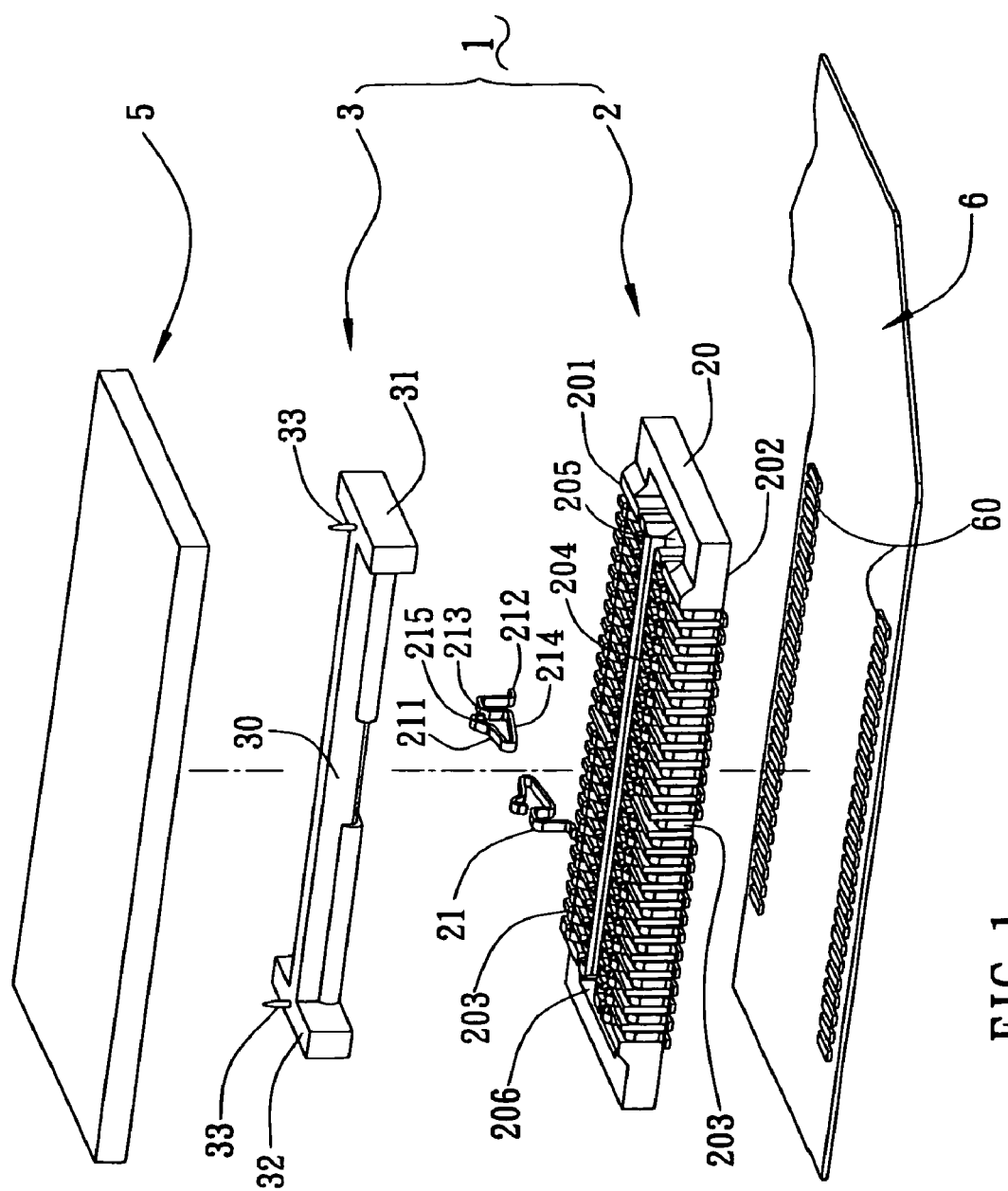
FIG. 1 is an exploded view of a board-to-board connector assembly of the present invention.
Figure 2:
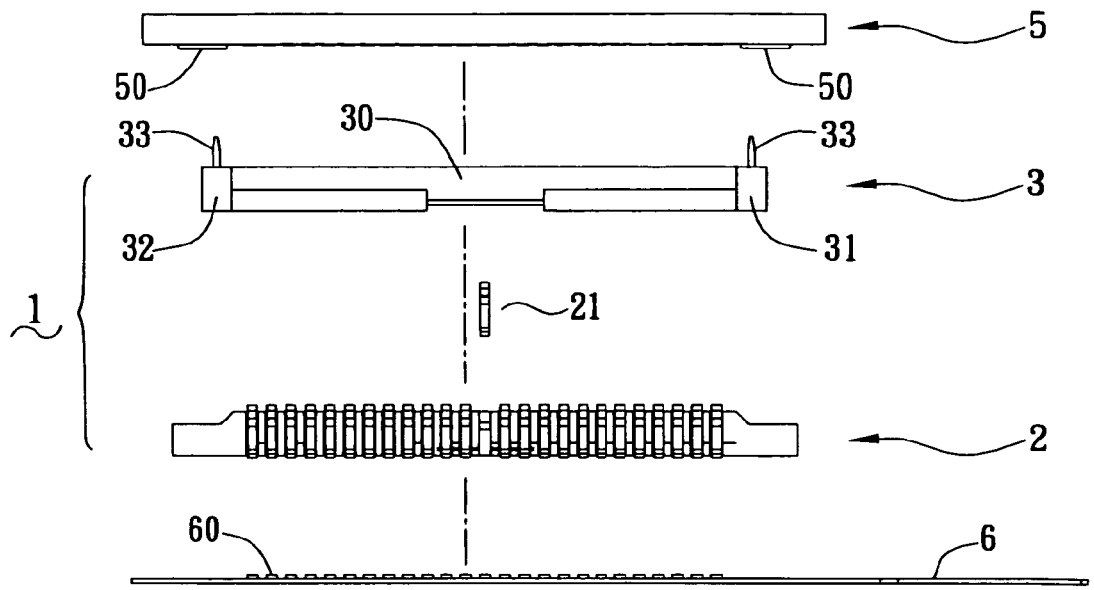
FIGS. 2–3 are front and side views of the board-to-board connector assembly of FIG. 1.
Figure 3:
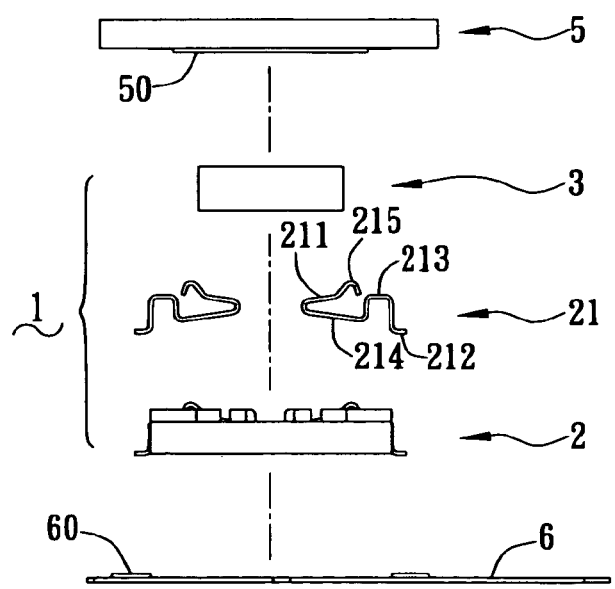

With reference to FIGS. 1–3, a board-to-board connector assembly 1 of the present invention is used to electrically connect first electrodes 50 of a printed circuit board (PCB) 5 and second electrodes 60 of a flexible circuit board 6. The board-to-board connector assembly 1 comprises a receptacle connector 2 and an engaging element 3 assembled together. The receptacle connector 2 is soldered to the flexible circuit board 6, and the engaging element 3 engages with the PCB 5.

The receptacle connector 2 comprises a flat insulative housing 20, a plurality of conductive terminals 21 received in the insulative housing 20. The insulative housing 20 is rectangular and has a mating surface 201 at a top thereof and a soldering surface 202 at a bottom thereof. A plurality of passageways 203 is transversely defined through opposite longitudinal sides of the insulative housing 20 and through the mating surface 201 and the soldering surface 202, respectively. The passageways 203 are longitudinally arranged of two arrays at both sides of the insulative housing for receiving the conductive terminals 21 therein. An engaging groove (not labeled) is defined in the insulative housing 20 for engaging with the engaging element 3. The engaging groove has an H shape and includes a middle groove 204 longitudinally between two arrays of the passageways 203, and a pair of side grooves 205, 206 transversely at opposite ends of the middle groove 204.

Figure 4:
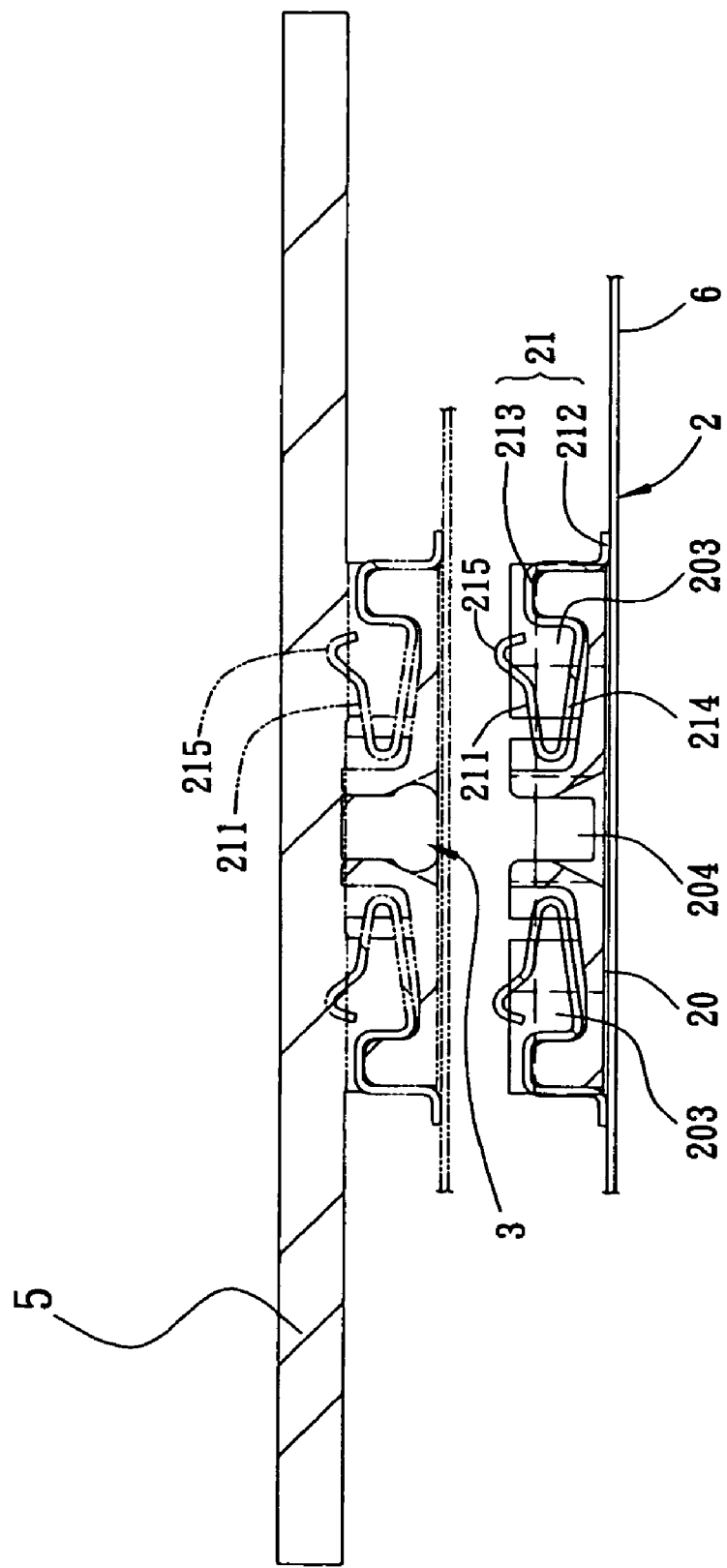
FIG. 4 is an assembled view of the board-to-board connector assembly of FIG. 1.

In combination with FIG. 1 and FIG. 4, each conductive terminal 21 comprises a contact portion 211 at an end thereof, a soldering portion 212 at an opposite end thereof, and a latching portion 213 and a connecting portion 214 between the contact portion 211 and the soldering portion 212. The connecting portion 214 is diagonal between the contact portion 211 and the latching portion 213 for providing resiliency of the contact portion 211. The latching portion 213 has an inverted-U shape and is transversely received in a passageway 203. The contact portion 211 has inverted-U shape and forms an arcuate end 215 slightly beyond the mating surface 201 for providing vertical signal transmission with the first electrodes 50 on the PCB 5.

The engaging element 3 has the same shape as the engaging groove. The engaging element 3 includes a longitudinal middle pole 30 for being embedded in the middle groove 204 and a pair of transverse side poles 31, 32 at opposite ends of the middle pole respectively for being embedded in the side grooves 205, 206. The middle pole 30 further forms an arcuate surface at a bottom thereof for facilitating insertion into the middle groove 204. Positioning portions 33 are arranged on the side poles 31, 32 and have cylindrical shape for corresponding to an assembling hole (not shown) in the PCB 5.

In assembly, the soldering portions 212 of the conductive terminals 21 are soldered on the second electrodes 60 of the flexible circuit board 6. The positioning portions 33 of the engaging element 3 are assembled to the assembling hole of the PCB 5. The middle pole 30 is embedded in the middle groove 204, and the side poles 31, 32 are respectively embedded in the side grooves 205, 206. Thus, the engaging element 3 is assembled in the engaging groove of the receptacle connector 2. The positioning portions 33 of the engaging element 3 guide the receptacle connector 2 to mate with the PCB 5 accurately and facilitate the conductive terminals 21 to contact the first electrodes 50 on the PCB 5 firmly. The engaging element 3 is almost entirely embedded in the receptacle connector 2, and therefore the overall height of the board-to-board connector assembly 1 effectively decreases. In addition, the arcuate ends 215 of the conductive terminals 21 vertically contact the first electrodes 50 of the PCB 5 to provide vertical signal transmission thereby assuring reliable communication.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A board-to-board connector assembly, which is adapted to electrically connect a first circuit board and a second circuit board, comprising:
   a) a receptacle connector including: soldered to the second circuit board and having:
      i) a flat insulative housing having a mating surface and a soldering surface, and a plurality of passageways being transversely defined through opposite sides of the insulative housing, an engaging groove located in the insulative housing;
      ii) a plurality of conductive terminals received in the passageways, and each conductive terminal including a contact portion at an end thereof, a soldering portion at an opposite end thereof and a connecting portion between the contact portion and the soldering portion, wherein the contact portion projecting slightly from the mating surface of the insulative housing providing a vertical signal transmission to the first circuit board; and
   b) an engaging element received in the engaging groove of the insulative housing and having positioning portions thereon guiding the receptacle connector to mate with the first circuit board accurately and facilitates the conductive terminals to contact first electrodes on the first circuit board firmly, wherein the insulative housing is rectangular, the engaging groove having an H-shape and including a middle groove longitudinally extending across a middle of the insulative housing and a pair of side grooves, each of the pair of side groove is located on one of two opposing ends of the middle groove, the engaging element having a shape corresponding with the engaging grove and including a middle pole inserted into the middle groove and a pair of side poles, one of the pair of side poles is inserted into each of the pair of side grooves.

2. The board-to-board connector assembly as claimed in claim 1, wherein the positioning portions are arranged on the side poles and having a cylindrical shape inserted into an assembling hole in the first circuit board.

3. The board-to-board connector assembly as claimed in claim 1, wherein the passageways are longitudinally arranged in two arrays and extend through the mating surface and the soldering surface.

4. The board-to-board connector assembly as claimed in claim 1, wherein each conductive terminal further comprises an inverted U-shaped latching portion located between the contact portion and the soldering portion.

5. The board-to-board connector assembly as claimed in claim 1, wherein the connecting portion of the terminal is diagonal providing the contact portion with resiliency.

6. The board-to-board connector assembly as claimed in claim 1, wherein the contact portion has an inverted-U shape and forms an arcuate end slightly beyond the mating surface for providing vertical signal transmission with the first electrodes on the first circuit board.

7. The board-to-board connector assembly as claimed in claim 1, wherein the engaging element having an arcuate surface at a bottom thereof for facilitating insertion into the receptacle connector.

8. The board-to-board connector assembly as claimed in claim 1, wherein the first circuit board is assembled with the engaging element, the second circuit board is a flexible circuit board, and the conductive terminals of the receptacle connector are soldered to the second circuit board.

* * * * *